(12) United States Patent
Kim et al.

(10) Patent No.: US 8,237,476 B2
(45) Date of Patent: Aug. 7, 2012

(54) SEMICONDUCTOR MEMORY DEVICE HAVING DELAY LOCK LOOP WITH WIDE FREQUENCY RANGE AND DELAY CELL CURRENT REDUCTION SCHEME

(75) Inventors: Jun-bae Kim, Seoul (KR); Chang-hyun Bae, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 153 days.

(21) Appl. No.: 12/878,080

(22) Filed: Sep. 9, 2010

(65) Prior Publication Data

US 2011/0095795 A1 Apr. 28, 2011

(30) Foreign Application Priority Data

Oct. 22, 2009 (KR) .......................... 10-2009-0100766

(51) Int. Cl.
*H03L 7/06* (2006.01)
(52) U.S. Cl. ........................................ 327/158; 327/149
(58) Field of Classification Search .................. 327/149, 327/158

See application file for complete search history.

(56) References Cited

U.S. PATENT DOCUMENTS

| 2010/0253404 A1* | 10/2010 | Ma ................................. 327/158 |
| 2010/0271144 A1* | 10/2010 | McCorquodale et al. ....................... 331/117 FE |
| 2010/0315147 A1* | 12/2010 | Booth ........................... 327/298 |
| 2011/0140759 A1* | 6/2011 | Booth ........................... 327/356 |
| 2011/0273209 A1* | 11/2011 | Lee ............................... 327/158 |
| 2011/0279157 A1* | 11/2011 | Mizukane et al. ............ 327/158 |
| 2012/0062295 A1* | 3/2012 | Lin ............................... 327/158 |
| 2012/0068753 A1* | 3/2012 | Lin ............................... 327/278 |

FOREIGN PATENT DOCUMENTS

| JP | 2008-228096 | 9/2008 |
| KR | 10-0795007 | 1/2008 |
| KR | 10-2008-0067466 | 7/2008 |

* cited by examiner

*Primary Examiner* — Lincoln Donovan
*Assistant Examiner* — Adam Houston
(74) *Attorney, Agent, or Firm* — Volentine & Whitt, PLLC

(57) ABSTRACT

A semiconductor memory device includes a delay lock loop (DLL) performing a locking operation at a wide frequency range and reducing current consumption. The semiconductor memory device includes a (DLL) having serially connected delay cells that receive and delay an external clock signal, wherein a predetermined number of delay cells of the serially connected delay cells that are to perform a delay operation are turned on in response to a threshold frequency recognition signal and first and second delay cell on signals, and for generating an internal clock signal; and a controller for generating the threshold frequency recognition signal and the first and second delay cell on signals, which reduce current consumption of each of the serially connected delay cells and increase a period of delay time thereof, if more delay cells are to be turned on when a delay cell indicating a threshold frequency is turned on.

20 Claims, 5 Drawing Sheets

SEMICONDUCTOR MEMORY DEVICE HAVING DELAY LOCK LOOP WITH WIDE FREQUENCY RANGE AND DELAY CELL CURRENT REDUCTION SCHEME

CROSS-REFERENCE TO RELATED APPLICATIONS

A claim of priority under 35 U.S.C. §119 is made to Korean Patent Application No. 10-2009-0100766, filed on Oct. 22, 2009, the disclosure of which is incorporated herein in its entirety by reference.

BACKGROUND

The inventive concept described herein generally relates to a semiconductor memory device, and more particularly to a semiconductor memory device having a delay lock loop with a wide frequency range and a delay cell current reduction scheme.

Similar to data transmission between a semiconductor memory device and a memory controller, an input and output method of transmitting data may have increased bus load and accelerated transmission frequency when transmission is in synchronization with a clock signal. It is thus important to temporally synchronize data with a clock signal. A phase lock loop (PLL) or a delay lock loop (DLL) may be used to temporally synchronize data with a clock signal.

A DLL is less affected by noise than a PLL, and is widely used in synchronous type semiconductor memory devices. Semiconductor memory devices operate at high speeds, and thus a DLL is required to perform locking operations at high speeds. A DLL may typically include a plurality of serially connected delay cells, and an external clock signal is received by one of the serially connected delay cells disposed at an input side of the DLL. Each of the serially connected delay cells delays the external clock signal for a predetermined period of time and outputs a delayed clock signal. In order to secure the characteristics of semiconductor memory devices operating at high speeds, each of the serially connected delay cells of the DLL has a relatively high consumption current, provides delay for a predetermined period of delay time, and is turned on so that the DLL may perform a locking operation at high speed.

Meanwhile, a DLL generally performs a locking operation over a wide frequency range according to an operation mode of a semiconductor memory device. When the semiconductor memory device operates at a low frequency, a greater number of delay cells of the DLL are turned on which consequently increases current consumption of the DLL, thereby increasing current consumption of the semiconductor memory device as a whole.

Therefore, there is a need for a DLL that performs a locking operation over a wide frequency range and with reduced current consumption.

SUMMARY

Exemplary embodiments of the inventive concept are generally related to a semiconductor memory device including a delay lock loop (DLL) that performs a locking operation over a wide frequency range and that reduces current consumption.

In an exemplary embodiment of the inventive concept, there is provided a semiconductor memory device including a delay lock loop (DLL) having a plurality of serially connected delay cells that receive and delay an external clock signal, wherein a predetermined number of delay cells of the plurality of serially connected delay cells that are to perform a delay operation are turned on in response to a threshold frequency recognition signal and first and second delay cell on signals, and for generating an internal clock signal; and a controller for generating the threshold frequency recognition signal and the first and second delay cell on signals, to reduce the current consumption of each of the plurality of serially connected delay cells and increase a period of delay time thereof, in the event that more delay cells are to be turned on when a delay cell indicating a threshold frequency is turned on.

Each of the plurality of serially connected delay cells further may include a register for storing on state information indicating whether the corresponding delay cell is turned on. Each register may be reset in response to the threshold frequency recognition signal indicating that a current operation frequency of the DLL is in a low frequency range.

Each of the plurality of serially connected delay cells may further include a first clock delay unit for receiving a clock signal at an input clock signal end, generating a first internal output clock signal delayed for a first period of delay time from the clock signal in response to the threshold frequency recognition signal and the first and second delay cell on signals, and generating the first internal output clock signal delayed for a second period of delay time that is longer than the first period of delay time from the clock signal in response to the first delay cell on signal; a second clock delay unit for receiving the first internal output clock signal, generating a second internal output clock signal delayed for the first period of delay time from the clock signal in response to the threshold frequency recognition signal and the first and second delay cell on signals, and generating the second internal output clock signal delayed for the second period of delay time from the first internal output clock signal in response to the first delay cell on signal; and a clock output unit for receiving the first internal output clock signal, generating an output clock signal delayed for the first period of delay time from the first internal output clock signal in response to the first and second delay cell on signals, and generating the output clock signal delayed for the second period of delay time from the first internal output clock signal in response to the first select signal, wherein the second internal output clock signal is connected to the input clock signal end of a next delay cell of the plurality of serially connected delay cells.

Current consumption of each of the plurality of serially connected delay cells for the second period of delay time may be less than that of each of the plurality of serially connected delay cells for the first period of delay time. Resistance of each of the plurality of serially connected delay cells for the second period of delay time may be greater than that of each of the plurality of serially connected delay cells for the first period of delay time.

The DLL may further include a first selection unit for selecting one of the plurality of output clock signals that are output from odd delay cells of the plurality of serially connected delay cells; and a second selection unit for selecting one of the plurality of output clock signals that are output from even delay cells of the plurality of serially connected delay cells, wherein the second selection unit selects one of the plurality of output clock signals that are output from an even delay cell adjacent to the odd delay cell selected by the first selection unit.

The DLL may further include a phase interpolation unit for receiving the output clock signals of the odd delay cells and the output clock signals of the even delay cells respectively selected by the first and second selection units, determining an interpolation step phase difference in response to a control code signal, performing a phase combination operation, and generating an interpolation clock signal output.

The DLL may further include a current amplification unit for receiving the interpolation clock signal output from the phase interpolation unit, maintaining a constant duty ratio of the interpolation clock signal output, and generating the internal clock signal.

The semiconductor memory device may further include a phase detection unit for detecting a phase difference between the external clock signal and a reference clock signal; and a delay compensation unit for generating the reference clock signal by delaying the internal clock signal according to time taken to output data out of the semiconductor memory device through a data output circuit, wherein the first and second delay cell on signals are generated according to a detection result of the phase detection unit.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
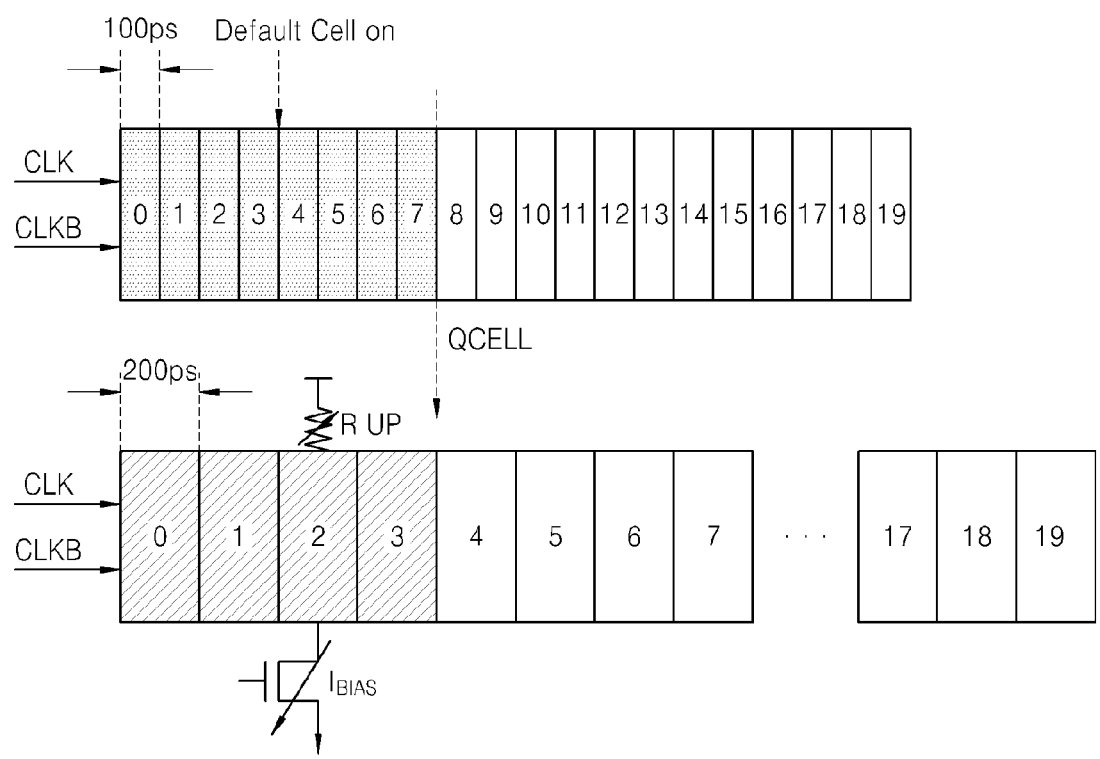
FIG. 1 is a conceptual diagram for explaining a method of operating a delay lock loop (DLL) according to an embodiment of the inventive concept.

The accompanying drawings for illustrating exemplary embodiments of the inventive concept are referred to in order to gain a sufficient understanding of the inventive concept, the merits thereof, and the objectives accomplished by the implementation of the inventive concept. Hereinafter, the inventive concept will be described in detail by explaining exemplary embodiments of the invention with reference to the accompanying drawings. Like reference numerals in the drawings denote like elements.

FIG. 1 is a conceptual diagram for explaining a method of operating a delay lock loop (DLL) according to an embodiment of the inventive concept. Referring to FIG. 1, the DLL includes a plurality of serially connected delay cells 0 through 19. The delay cell 0 receives a pair of external clock signals CLK and CLKB. The DLL performs a locking operation consisting of synchronizing the pair of external clock signals CLK and CLKB and a reference clock signal using a feedback signal that has been delayed for a predetermined period of time.

The delay cells 0 through 7 are turned on and the delay cell 8 is turned on in order to perform the locking operation. The delay cell 8 may be a delay cell QCELL indicating a threshold frequency. A current operation frequency of the DLL is a low frequency. If, for example, a delay time of one turned on delay cell is 100 ps and current consumption thereof is 400 uA, since 8 delay cells are turned on in order to perform the locking operation, the DLL needs a locking time of 800 ps and current consumption of 3200 uA.

If the delay cell QCELL is turned on, information about the delay cells 0 through 7 that have been turned on is reset, and subsequent delay cells are turned on from a default delay cell (here, the delay cell 3) that has been turned on. In this regard, the delay time of the subsequent delay cells is increased by reducing a bias current of each of the subsequent delay cells and increasing a resistance thereof. For example, the current consumption of one delay cell is reduced from 400 uA to 200 uA and the delay time thereof is increased from 100 ps to 200 ps by reducing the bias current of the delay cell by half and increasing the resistance thereof to be twice as high. Thus, since the 4 delay cells 0 through 3 are turned on in order to perform the locking operation, the DLL needs a locking time of 800 ps and current consumption of 1600 uA. Before and after the delay cells are reset, since there is no difference in the locking time, the current consumption is reduced by half without loss. In the present embodiment, since the DLL performs the locking operation for a delay corresponding to the delay from the delay cell 0 to the default delay cell (the delay cell 3), the subsequent delay cells are not turned on after the default delay cell (the delay cell 3) that is turned on.

Figure 2:
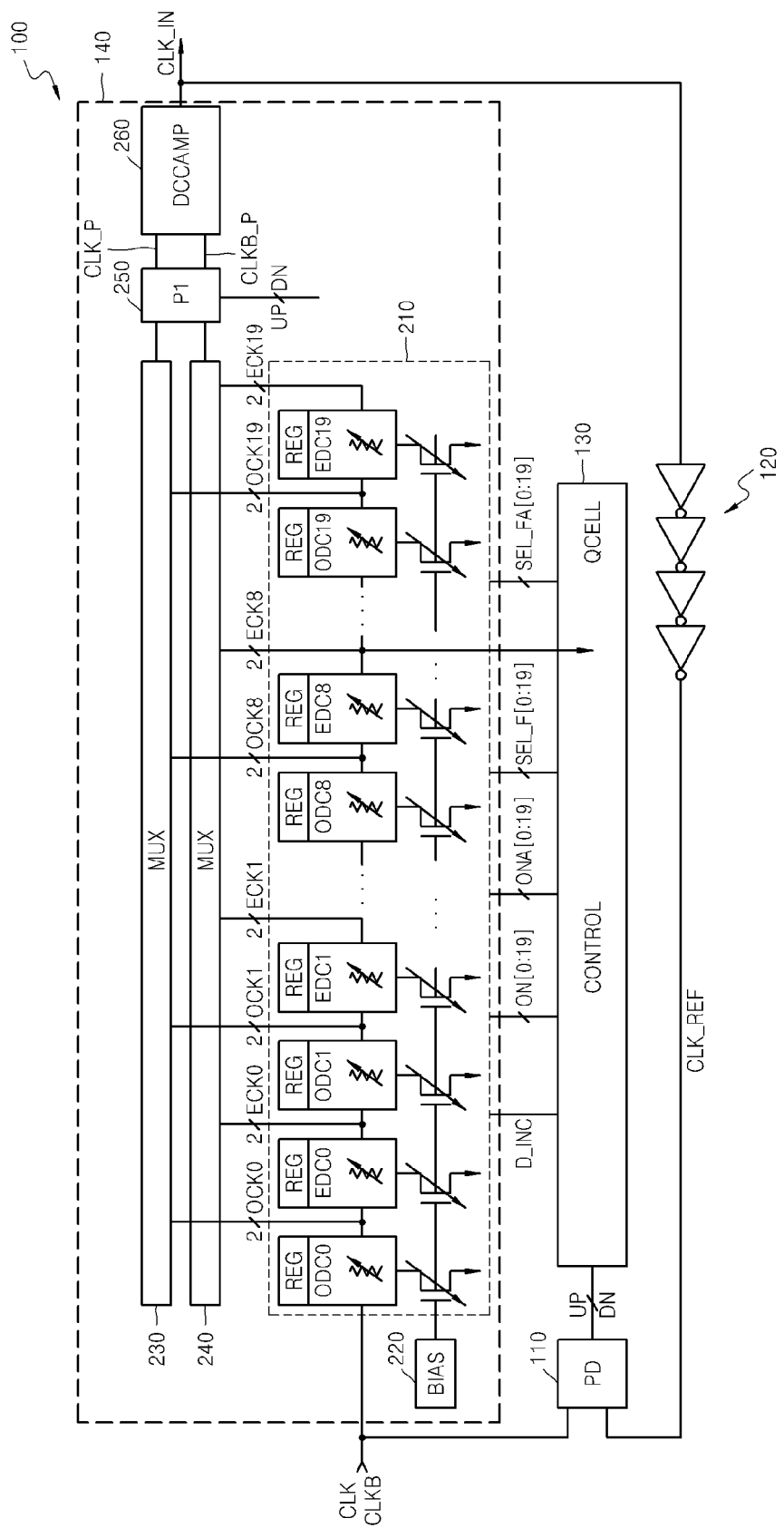
FIG. 2 is a circuit diagram of a semiconductor memory device for performing the method of operating the DLL of FIG. 1, according to an embodiment of the inventive concept.

FIG. 2 is a circuit diagram of a semiconductor memory device 100 that may perform the method of operating the DLL of FIG. 1, according to an embodiment of the inventive concept. Referring to FIG. 2, the semiconductor memory device 100 includes a phase detector 110 for detecting a phase difference between an external clock signal CLK and a reference clock signal CLK_REF, a delay compensator 120 for delaying an internal clock signal CLK_IN and generating the reference clock signal CLK_REF, a controller 130 for generating a plurality of control signals, and a DLL 140 for receiving the external clock signal CLK and an external clock signal CLKB and generating the internal clock signal CLK_IN.

The phase detector 110 detects the phase difference between the external clock signal CLK and the reference clock signal CLK_REF and generates an up signal UP and a down signal DN according to the detection result. The delay compensator 120 delays the internal clock signal CLK_IN according to time taken to output data out of the semiconductor memory device 100 through a data output circuit (not shown) and generates the reference clock signal CLK_REF.

The controller 130 generates a plurality of control signals in response to the up signal UP and the down signal DN generated by the phase detector 110. The control signals include a threshold frequency recognition signal D_INC for indicating whether a current operation frequency is in a low frequency range, a plurality of first delay cell on signals ON[0:19] and a plurality of second delay cell on signals ONA[0:19] for respectively turning on a plurality of delay cells of the DLL 140, and a plurality of first select signals SEL_F[0:19] and a plurality of second select signals SEL_FA [0:19] for respectively selecting outputs of the plurality of delay cells of the DLL 140. The threshold frequency recognition signal D_INC is generated when the delay cell QCELL is turned on.

The DLL 140 receives the pair of external clock signals CLK and CLKB and generates the internal clock signal CLK_IN, and includes a delay circuit unit 210, a bias unit 220, a first selection unit 230, a second selection unit 240, a phase interpolation unit 250, and a current amplification unit 260.

The delay circuit unit 210 includes a plurality of serially connected delay cells ODC0 through ODC19 and EDC0 through EDC19 for receiving and delaying the pair of external clock signals CLK and CLKB. The delay circuit unit 210 selects a predetermined number of delay cells from among the serially connected delay cells ODC0 through ODC19 and EDC0 through EDC19 to perform a delay operation according to the first delay cell on signals ON[0:19] and the second delay cell on signals ONA[0:19] that are sequentially activated, selects a predetermined number of delay cells from among the serially connected delay cells ODC0 through ODC19 and EDC0 through EDC19 to perform an output operation in response to the first select signals SEL_F[0:19] and the second select signals SEL_FA[0:19], and outputs delayed pairs of external clock signals OCK0 through OCK19 and ECK0 through ECK19.

In the delay circuit unit 210, the even second delay cells EDC0 through EDC19 and the odd first delay cells ODC0 through ODC19 are respectively alternately connected to each other. The first delay cell ODC0 receives the pair of external clock signals CLK and CLKB, delays the pair of external clock signals CLK and CLKB for a first period of delay time or for a second period of delay time, and outputs the first delay clock signal OCK0 and a first delay clock signal OCKB0 (not shown). The second delay cell EDC0 receives the pair of first delay clock signals OCK0 and OCKB0 output from the first delay cell ODC0, delays the pair of first delay clock signals OCK0 and OCKB0 for the first period of delay time or for the second period of delay time, and outputs the second delay clock signal ECK0 and a second delay clock signal ECKB0 (not shown). The first delay cells ODC1 through ODC19 operate in a similar manner to the first delay cell ODC0 and respectively output the first delay clock signals OCK1 and first delay clock signals OCK1B (not shown) through OCK19 and OCKB19 (not shown). The second delay cells EDC1 through EDC19 operate in a similar manner to the second delay cell EDC0 and respectively output the second delay clock signals ECK1 and second delay clock signals ECKB1 (not shown) through ECK19 and ECKB19 (not shown).

Each of the first delay cells ODC0 through ODC19 and each of the second delay cells EDC1 through EDC19 may delay a received pair of input clock signals for the first period of delay time according to the threshold frequency recognition signal D_INC and the corresponding first delay cell on signal ON[0:19] and second delay cell on signal ONA[0:19] generated by the controller 130. Each of the first delay cells ODC0 through ODC19 and each of the second delay cells EDC1 through EDC19 may delay a received pair of input clock signals for the second period of delay time according to the corresponding first delay cell on signal ON[0:19]. In order to perform a DLL locking operation, when each of the first delay cells ODC0 through ODC19 and each of the second delay cells EDC1 through EDC19 are turned on, each of the first delay cells ODC0 through ODC19 and each of the second delay cells EDC1 through EDC19 include a register REG for storing on state information. The on state information stored in the register REG may be reset according to the threshold frequency recognition signal D_INC. In this regard, the controller 130 resets the first delay cell on signals ON[0:19] and second delay cell on signals ONA[0:19], and turns on the first delay cell on signals ON[0:19] again.

Each of the first delay cells ODC0 through ODC19 and each of the second delay cells EDC1 through EDC19 may output the pairs of first clock signals OCK0 through OCK19 and the second delay clock signals ECK0 through ECK19 that are delayed for the first period of delay time or for the second period of delay time from the received pairs of the input clock signals in response to the first select signals SEL_F[0:19] and the second select signals SEL_FA[0:19] generated by the controller 130. The construction of each of the first delay cells ODC1 through ODC19 and each of the second delay cells EDC0 through EDC19 is the same as that of the first delay cell ODC0, as shown in FIG. 3.

Figure 3:
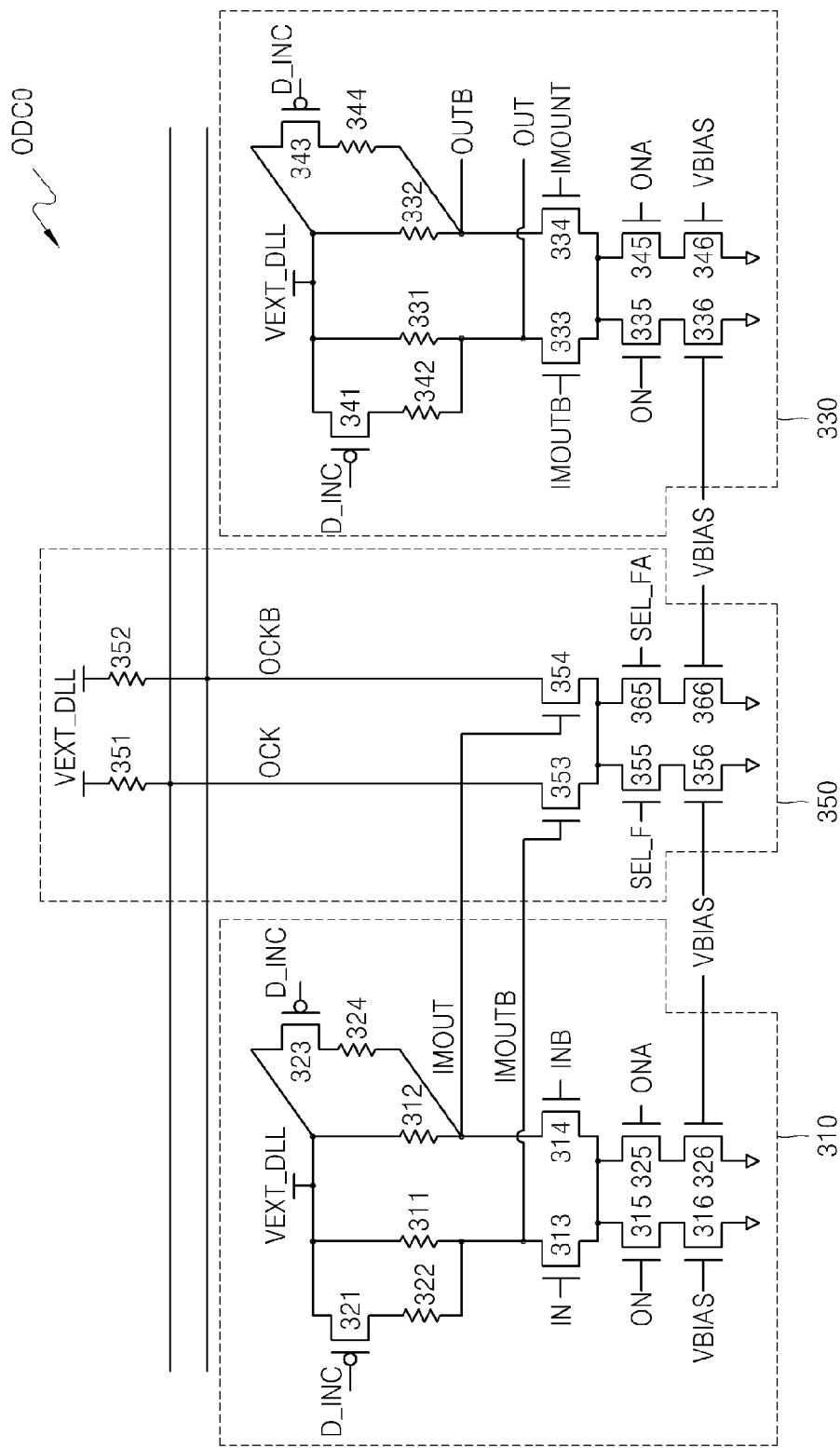
FIG. 3 is a circuit diagram of a first delay cell of FIG. 2 according to an embodiment of the inventive concept.

FIG. 3 is a circuit diagram of the first delay cell ODC0 of FIG. 2 according to an embodiment of the inventive concept. Referring to FIG. 3, the first delay cell ODC0 includes a first clock delay unit 310, a second clock delay unit 330, and a clock output unit 350. The first clock delay unit 310 includes first and second resistors 311 and 312 that are connected to a power voltage VEXT_DLL, first and second transistors 313 and 314 that are respectively connected to the first and second resistors 311 and 312 and may be respectively turned on in response to a pair of input clock signals IN and INB, a third transistor 315 that is connected to the first and second transistors 313 and 314 and may be turned on in response to a first delay cell on signal ON, and a fourth transistor 316 may be turned on in response to a bias voltage VBIAS. The bias voltage VBIAS is provided by the bias unit 220 of the DLL 140, which will be described later.

The first clock delay unit 310 further includes a fifth transistor 321 and a third resistor 322 that are connected in parallel to the first resistor 311, a sixth transistor 323 and a fourth resistor 324 that are connected in parallel to the second resistor 312, and seventh and eighth transistors 325 and 326 that are connected in parallel to the third and fourth transistors 315 and 316. The fifth transistor 321 and the sixth transistor 323 may be respectively turned on in response to the threshold frequency recognition signal D_INC. The seventh transistor 325 may be turned on in response to the second delay cell on signal ONA. The eighth transistor 326 may be turned on in response to the bias voltage VBIAS. A connection node between the first resistor 311, the third resistor 322, and the first transistor 313 may generate a first internal output clock signal IMOUTB. A connection node between the second resistor 312, the fourth resistor 324, and the second transistor 314 may generate a first internal output clock signal IMOUT.

The second clock delay unit 330 includes fifth and sixth resistors 331 and 332 that are connected to the power voltage VEXT_DLL, ninth and tenth transistors 333 and 334 that are respectively connected to the fifth and sixth resistors 331 and 332 and may be respectively turned on in response to the pair of first internal output clock signals IMOUTB and IMOUT, an eleventh transistor 335 that is connected to the ninth and tenth transistors 333 and 334 and may be turned on in response to the first delay cell on signal ON, and a twelfth transistor 336 may be turned on in response to the bias voltage VBIAS. The second clock delay unit 330 further includes a thirteenth transistor 341 and a seventh resistor 342 that are connected in parallel to the fifth resistor 331, a fourteenth transistor 343 and an eighth resistor 344 that are connected in parallel to the sixth resistor 332, and fifteenth and sixteenth transistors 345 and 346 that are connected in parallel to the eleventh and twelfth transistors 335 and 336.

The thirteenth transistor 341 and the fourteenth transistor 343 may be turned on in response to the threshold frequency recognition signal D_INC. The fifteenth transistor 345 may be turned on in response to the second delay cell on signal ONA. The sixteenth transistor 346 may be turned on in response to the bias voltage VBIAS. A connection node between the fifth resistor 331, the seventh resistor 342, and the ninth transistor 333 may generate a second internal output clock signal OUT. A connection node between the sixth resistor 332, the eighth resistor 344, and the tenth transistor 334 may generate a second internal output clock signal OUTB.

The clock output unit 350 includes ninth and tenth resistors 351 and 352 that are connected to the power voltage VEXT- _DLL, seventeenth and eighteenth transistors 353 and 354 that are respectively connected to the ninth and tenth resistors 351 and 352 and that may be respectively turned on in response to the pair of first internal output clock signals IMOUTB and IMOUT, a nineteenth transistor 355 that is connected to the seventeenth and eighteenth transistors 353 and 354 and may be turned on in response to the first select signal SEL_F, and a twentieth transistor 356 may be turned on in response to the bias voltage VBIAS. The clock output unit 350 further includes twenty-first and twenty-second transistors 365 and 366 that are connected in parallel to the nineteenth and twentieth transistors 355 and 356.

The twenty-first transistor 365 may be turned on in response to the second select signal SEL_FA. The twenty-second transistor 366 may be turned on in response to the bias voltage VBIAS. A connection node between the ninth resistor 351 and the seventeenth transistor 353 may generate an output clock signal OCK. A connection node between the tenth resistor 352 and the eighteenth transistor 354 may generate an output clock signal OCKB. The clock output unit 350 is similar to the first selection unit 230, which will be described later, and outputs the pair of output clock signals OCK and OCKB in response to the first select signal SEL_F and the second select signal SEL_FA. However, the current consumption of the delay cell ODC of the clock output unit 350 is influenced by the first select signal SEL_F and the second select signal SEL_FA, and thus the clock output unit 350 is described with the operation of the first selection unit 230 in the first delay cell ODC0.

The second delay cell on signal ONA and the second select signal SEL_FA are generated by control signal generation circuits of the controller 130 of FIG. 2, which will be described with reference to FIGS. 4A and 4B.

Figure 4A:
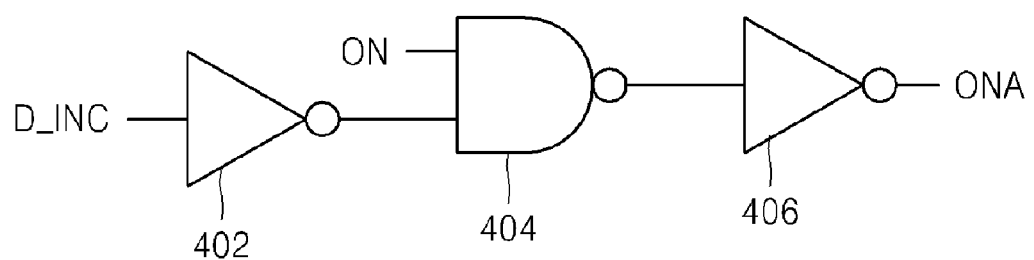
FIGS. 4A and 4B are circuit diagrams of control signal generation circuits of a controller of FIG. 2 according to embodiments of the inventive concept.

Referring to FIG. 4A, the control signal generation circuit includes a first inverter 402 that has as an input the threshold frequency recognition signal D_INC, a NAND gate 404 that has as inputs the first delay cell on signal ON and an output of the first inverter 402, and a second inverter 406 that has as an input an output of the NAND gate 404 and that outputs the second delay cell on signal ONA. The threshold frequency recognition signal D_INC is used to recognize whether a current operation frequency of the DLL 140 is in a low frequency range. That is, the threshold frequency recognition signal D_INC is at a logic low when operation frequency of the DLL 140 is in a high frequency range and is at a logic high when operation frequency of the DLL 140 is in the low frequency range. If a corresponding delay cell is turned on, the first delay cell on signal ON is logic high. Thus, when the current operation frequency of the DLL 140 is in the high frequency range and the corresponding delay cell is turned on, the first delay cell on signal ON and the second delay cell on signal ONA are logic high. On the contrary, when the current operation frequency of the DLL 140 is in the low frequency range and the corresponding delay cell is turned on, the first delay cell on signal ON is logic high, and the second delay cell on signal ONA is logic low.

Figure 4B:
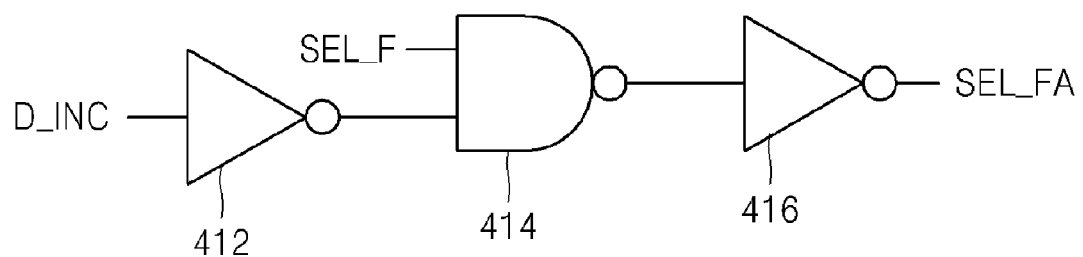

Referring to FIG. 4B, the control signal generation circuit also includes a first inverter 412 that has as an input the threshold frequency recognition signal D_INC, a NAND gate 414 that has as inputs the first select signal SEL_F and an output of the first inverter 412, and a second inverter 416 that has as an input an output of the NAND gate 414 and that outputs the second select signal SEL_FA. If a pair of output clock signals of a corresponding delay cell is selected, the first select signal SEL_F is logic high. Thus, when the current operation frequency of the DLL 140 is in the high frequency range and the pair of output clock signals of the corresponding delay cell is selected, the first select signal SEL_F and the second select signal SEL_FA are logic high. On the contrary, when the current operation frequency of the DLL 140 is in the low frequency range and the pair of output clock signals of the corresponding delay cell is selected, the first select signal SEL_F is logic high, and the second select signal SEL_FA is logic low.

The operation of the first delay cell ODC0 of FIG. 3 will now be described based on the control signals generated by the control signal generation circuits of FIGS. 4A and 4B.

The first clock delay unit 310 has as inputs the pair of input clock signals IN and INB, and outputs the pair of input clock signals IN and INB inverted as the pair of first internal output clock signals IMOUT and IMOUTB. The second clock delay unit 330 has as inputs the pair of first internal output clock signals IMOUT and IMOUTB, and outputs the pair of first internal output clock signals IMOUT and IMOUTB inverted as the pair of second internal output clock signals OUT and OUTB. Thus, the pair of input clock signals IN and INB is delayed for a predetermined period of time, generating the pair of second internal output clock signals OUT and OUTB.

When the current operation frequency of the DLL 140 is in a high frequency range, a corresponding delay cell is turned on, and a pair of output clock signals of the corresponding delay cell is selected, the fifth transistor 321 and the sixth transistor 323 are turned on in response to the threshold frequency recognition signal D_INC being logic low. The third and fourth transistors 315 and 316 and the eleventh and the twelfth transistors 335 and 336 are turned on respectively in response to the first delay cell on signal ON and the bias voltage VBIAS. The seventh and eighth transistors 325 and 326 and the fifteenth and sixteenth transistors 345 and 346 are turned on respectively in response to the second delay cell on signal ONA and the bias voltage VBIAS. The nineteenth and twentieth transistors 355 and 356 are turned on respectively in response to the first select signal SEL_F and the bias voltage VBIAS. The twenty-first and twenty-second transistors 365 and 366 are turned on respectively in response to the second select signal SEL_FA and the bias voltage VBIAS. It is assumed that the first period of delay time of the first delay cell ODC0 is about 100 ps and the current consumption thereof is about 400 uA, as described with reference to FIG. 1.

When the current operation frequency of the DLL 140 is in a low frequency range, a corresponding delay cell is turned on, and a pair of output clock signals of the corresponding delay cell is selected, the fifth transistor 321 and the sixth transistor 323 are turned off in response to the threshold frequency recognition signal D_INC being logic high. The third and fourth transistors 315 and 316 and the eleventh and the twelfth transistors 335 and 336 are turned off respectively in response to the first delay cell on signal ON being logic high and the bias voltage VBIAS. The seventh transistor 325 and the fifteenth transistor 345 are turned on in response to the second delay cell on signal ONA being logic low. The nineteenth and twentieth transistors 355 and 356 are turned on respectively in response to the first select signal SEL_F being logic high and the bias voltage VBIAS. The twenty-first transistor 365 is turned off in response to the second select signal SEL_FA being logic low. Thus, the resistance of the first delay cell ODC0 is increased to be twice as high and the current consumption thereof is reduced by half and thus the second period of delay time of the first delay cell ODC0 is about 200 ps and the current consumption thereof is about 200 uA.

The first delay cell ODC0 has as inputs the pair of external clock signals CLK and CLKB as the pair of input clock signals IN and INB, and outputs the pair of output clock signals OCK and OCKB. The first delay cell ODC0 is connected in series to the second delay cell EDC0 as shown in the delay cell unit 210 of FIG. 2. The pair of the second internal clock signals OCK and OCKB of the first delay cell ODC0 is connected in series to the pair of input clock signals IN and INB of the second delay cell EDC0. The serial connection structure is applied to the other delay cells ODC1 through ODC19 and EDC1 through EDC19 in the same manner.

Referring back to FIG. 2, the bias unit 220 of the DLL 140 supplies the bias voltage VBIAS in order to prevent the delay cells ODC0 through ODC19 and EDC0 through EDC19 from malfunctioning due to fluctuations of a bias level caused by power noise when analog circuits of the DLL 140 are operating.

The first and second selection units 230 and 240 select pairs of delayed clock signals output from two adjacent delay cells among the delay cells ODC0 through ODC19 and EDC0 through EDC19 in response to (some of) the first select signals SEL_F[0:19] and the second select signals SEL_FA[0:19] and transfer the pairs of delayed clock signals to the phase interpolation unit 250. The pairs of the delayed clock signals selected by the first and second selection units 230 and 240 result from a coarse locking operation.

The phase interpolation unit 250 receives the pair of first delayed clock signals OCK and OCKB and the pair of second delayed clock signals ECK and ECKB selected by the first and second selection units 230 and 240, determines whether a phase combination operation is (to be) performed and a delay amount, performs a fine locking operation of combining the pair of first delayed clock signals OCK and OCKB and the pair of second delayed clock signals ECK and ECKB according to a phase variable amount, and outputs a pair of interpolation clock signals CLK_P and CLKB_P. If the delay circuit unit 210 completely performs the coarse locking operation, the phase interpolation unit 250 generates control code signals (not shown) based on the up signal UP and the down signal DN generated by the phase detection unit 120, and performs the phase combination operation in response to the control code signals.

The control code signals are binary code signals including a plurality of bits. The number of bits of the control code signals is adjusted in order to determine an interpolation step phase difference between phases of the pair of first delayed clock signals OCK and OCKB and the pair of second delayed clock signals ECK and ECKB. The interpolation step phase difference is determined according to the number of established interpolation steps, i.e., the number of interpolation clock signals included between phases of two delayed clock signals. The greater the number of interpolation steps, the less the difference between phases of interpolation clock signals, and the less the number of interpolation steps, the greater the difference between phases of interpolation clock signals. For example, if a control code signal is 3 bits, the phase interpolation unit 250 outputs one of the pair of interpolation clock signals CLK_P and CLKB_P respectively including eight interpolation steps between the pair of first delayed clock signals OCK and OCKB and the pair of second delayed clock signals ECK and ECKB. If the control code signal is 5 bits, the phase interpolation unit 250 outputs one of the pair of interpolation clock signals CLK_P and CLKB_P respectively including thirty two interpolation steps between the pair of first delayed clock signals OCK and OCKB and the pair of second delayed clock signals ECK and ECKB.

When the current amplification unit 260 receives the pair of interpolation clock signals CLK_P and CLKB_P output from the phase interpolation unit 250 and a duty ratio distortion of the pair of interpolation clock signals CLK_P and CLKB_P occurs, the current amplification unit 260 adjusts a reference phase voltage and maintains a duty ratio. The current amplification unit 260 connects a capacitor having a large capacitance to an output terminal of a delay cell current pumping circuit (not shown) having the structure of an amplifier, filters a delay cell current, connects the capacitor to an input terminal of the current amplification unit 260, and inputs an amplified output to the delay cell current pumping circuit, so that a voltage level of the delay cell current increases until the duty ratio of the pair of interpolation clock signals CLK_P and CLKB_P is 50:50.

If the duty ratio of the pair of interpolation clock signals CLK_P and CLKB_P is 50:50, an amount charged into a delay cell current capacitor is the same as that of an amount discharged therefrom, so that the delay cell current maintains a predetermined voltage level and thus although the duty ratio of the pair of interpolation clock signals CLK_P and CLKB_P may be distorted, the duty ratio is maintained by adjusting the reference phase voltage.

Thus, as described with reference to FIG. 1, if more delay cells are turned on when the DLL 140 performs a locking operation, each delay cell that is turned on stores on state information in the register REG therein, and a delay period of time of a turned on delay cell is about 100 ps and current consumption thereof is about 400 uA in response to the threshold frequency recognition signal D_INC, the first delay cell signals ON[0:19], and the second delay cell signals ONA [0:19]. If the QCELL is turned on, since the DLL 140 performs the locking operation when eight delay cells are turned on, the DLL 140 needs a locking period time of 800 ps and current consumption of 3200 uA.

If the QCELL is turned on, i.e., if a current operation frequency of the DLL 140 is in a low frequency range, the on state information of the eight delay cells that are turned on is reset, a delay period of time of a delay cell that is turned on is about 200 ps and current consumption thereof is about 200 uA in response to the first delay cell on signal ON[0:19]. Since four delay cells are turned on in order to perform the locking operation of the DLL 140, the DLL 140 needs a locking period time of 800 ps and current consumption of 1600 uA. Thus, when the semiconductor memory device 100 operates at a low frequency, the current consumption is reduced by half without loss of locking period time.

Figure 5:
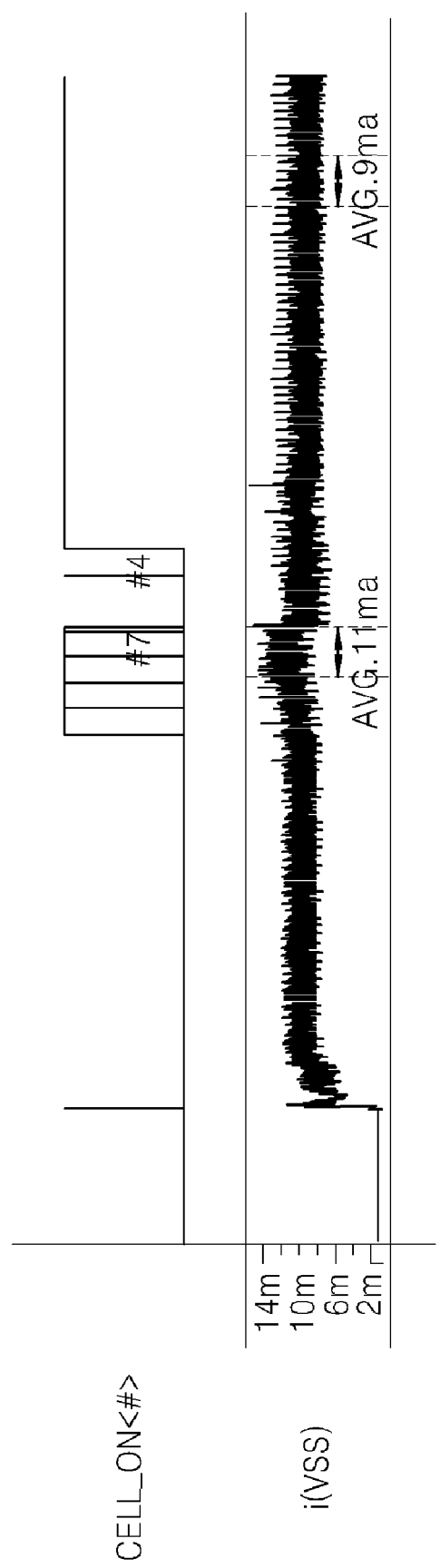
FIG. 5 is a graph of current consumption with respect to the number of delay cells of the semiconductor memory device of FIG. 1 that are turned on, according to an embodiment of the inventive concept.

FIG. 5 is a graph of current consumption with respect to the number of delay cells that are turned on as a result of simulating the operation of the semiconductor memory device 100 of FIG. 2. Referring to FIG. 5, if seven delay cells are turned on, until the eight delay cell QCELL is turned on, the current consumption of the semiconductor memory device 100 is about 11 mA. Thereafter, if four delay cells are turned on in order to perform a DLL locking operation, the current consumption of the semiconductor memory device 100 is reduced to about 9 mA.

While the inventive concept has been particularly shown and described with reference to exemplary embodiments thereof, it will be understood that various changes in form and details may be made therein without departing from the spirit and scope of the following claims.

What is claimed is:

1. A semiconductor memory device comprising:
a delay lock loop (DLL) including a plurality of serially connected delay cells that receive and delay an external clock signal, wherein a predetermined number of delay cells of the plurality of serially connected delay cells that are to perform a delay operation are turned on in response to a threshold frequency recognition signal and first and second delay cell on signals, and for generating an internal clock signal; and
a controller for generating the threshold frequency recognition signal and the first and second delay cell on signals, to reduce the current consumption of each of the plurality of serially connected delay cells and increase a period of delay time thereof, in the event that more delay cells are to be turned on when a delay cell indicating a threshold frequency is turned on.

2. The semiconductor memory device of claim 1, wherein each of the plurality of serially connected delay cells further comprises a register for storing on state information indicating whether the corresponding delay cell is turned on.

3. The semiconductor memory device of claim 2, wherein the registers are reset in response to the threshold frequency recognition signal indicating that a current operation frequency of the DLL is in a low frequency range.

4. The semiconductor memory device of claim 1, wherein each of the plurality of serially connected delay cells further comprises:
  a first clock delay unit for receiving a clock signal at an input clock signal end, generating a first internal output clock signal delayed for a first period of delay time from the clock signal in response to the threshold frequency recognition signal and the first and second delay cell on signals, and generating the first internal output clock signal delayed for a second period of delay time that is longer than the first period of delay time from the clock signal in response to the first delay cell on signal;
  a second clock delay unit for receiving the first internal output clock signal, generating a second internal output clock signal delayed for the first period of delay time from the clock signal in response to the threshold frequency recognition signal and the first and second delay cell on signals, and generating the second internal output clock signal delayed for the second period of delay time from the first internal output clock signal in response to the first delay cell on signal; and
  a clock output unit for receiving the first internal output clock signal, generating an output clock signal delayed for the first period of delay time from the first internal output clock signal in response to the first and second delay cell on signals, and generating the output clock signal delayed for the second period of delay time from the first internal output clock signal in response to the first select signal,
  wherein the second internal output clock signal is connected to the input clock signal end of a next delay cell of the plurality of serially connected delay cells.

5. The semiconductor memory device of claim 4, wherein current consumption of each of the plurality of serially connected delay cells for the second period of delay time is less than that of each of the plurality of serially connected delay cells for the first period of delay time.

6. The semiconductor memory device of claim 4, wherein resistance of each of the plurality of serially connected delay cells for the second period of delay time is greater than that of each of the plurality of serially connected delay cells for the first period of delay time.

7. The semiconductor memory device of claim 4, wherein the DLL further comprises:
  a first selection unit for selecting one of the plurality of output clock signals that are output from odd delay cells of the plurality of serially connected delay cells; and
  a second selection unit for selecting one of the plurality of output clock signals that are output from even delay cells of the plurality of serially connected delay cells, wherein the second selection unit selects one of the plurality of output clock signals that are output from an even delay cell adjacent to the odd delay cell selected by the first selection unit.

8. The semiconductor memory device of claim 7, wherein the DLL further comprises:
  a phase interpolation unit for receiving the output clock signals of the odd delay cells and the output clock signals of the even delay cells respectively selected by the first and second selection units, determining an interpolation step phase difference in response to a control code signal, performing a phase combination operation, and generating an interpolation clock signal output.

9. The semiconductor memory device of claim 8, wherein the DLL further comprises:
  a current amplification unit for receiving the interpolation clock signal output from the phase interpolation unit, maintaining a constant duty ratio of the interpolation clock signal output, and generating the internal clock signal.

10. The semiconductor memory device of claim 9, further comprising:
  a phase detection unit for detecting a phase difference between the external clock signal and a reference clock signal; and
  a delay compensation unit for generating the reference clock signal by delaying the internal clock signal according to time taken to output data out of the semiconductor memory device through a data output circuit,
  wherein the first and second delay cell on signals are generated according to a detection result of the phase detection unit.

11. A method of operating a delay lock loop (DLL) having a plurality of serially connected delay cells comprising:
  receiving an external clock signal; and
  generating an internal clock signal by synchronizing the external clock signal and a reference clock signal using first and second delay cell on signals which select a predetermined number of delay cells among the serially connected delay cells and a threshold frequency recognition signal which means that a current operation frequency of the DLL is a low frequency.

12. The method of operating the delay lock loop (DLL) of claim 11, wherein the threshold frequency recognition signal is generated in the event that more delay cells are to be turned on when a delay cell indicating the low frequency is turned on.

13. The method of operating the delay lock loop (DLL) of claim 11, wherein each of the plurality of serially connected delay cells stores on state information indicating whether the corresponding delay cell is turned on.

14. The method of operating the delay lock loop (DLL) of claim 13, each of the plurality of serially connected delay cells resets the on state information in response to the threshold frequency recognition signal.

15. The method of operating the delay lock loop (DLL) of claim 14, wherein subsequent delay cells are turned on from a default delay cell that has been turned on among the plurality of serially connected delay cells.

16. The method of operating the delay lock loop (DLL) of claim 11, further comprises:
  receiving the clock signal at an in put clock signal end of a delay cell of the plurality of serially connected delay cells;
  generating a first internal output clock signal delayed for a first period of delay time from the clock signal in response to the threshold frequency recognition signal and the first and second delay cell on signals, and
  generating the first internal output clock signal delayed for a second period of delay time that is longer than the first period of delay time from the clock signal in response to the first delay cell on signal.

17. The method of operating the delay lock loop (DLL) of claim 16, further comprises:
  receiving the first internal output clock signal;
  generating a second internal output clock signal delayed for the first period of delay time from the clock signal in response to the threshold frequency recognition signal and the first and second delay cell on signals; and generating the second internal output clock signal delayed for the second period of delay time from the first internal output clock signal in response to the first delay cell on signal.

18. The method of operating the delay lock loop (DLL) of claim 17, further comprises:

receiving the first internal output clock signal, generating the internal clock signal delayed for the first period of delay time from the first internal output clock signal in response to first and second select signals; and generating the internal clock signal delayed for the second period of delay time from the first internal output clock signal in response to the first select signal, wherein the second internal output clock signal is connected to the input clock signal end of a next delay cell of the plurality of serially connected delay cells.

19. The method of operating the delay lock loop (DLL) of claim 18, wherein current consumption of each of the plurality of serially connected delay cells for the second period of delay time is less than that of each of the plurality of serially connected delay cells for the first period of delay time.

20. The method of operating the delay lock loop (DLL) of claim 11 further comprises:

detecting a phase difference between the external clock signal and a reference clock signal; and generating the first and second delay cell on signals and a threshold frequency recognition signal in response to the phase difference.

* * * * *